Nov. 4, 1969 R. M. BURTON ET AL 3,476,981

MINIATURE POWER CIRCUIT ASSEMBLY

Filed Oct. 10, 1967

INVENTORS

BY Robert M. Burton, & Glen E. Harland

L. J. Wallace

ATTORNEY

United States Patent Office 3,476,981
Patented Nov. 4, 1969

3,476,981

MINIATURE POWER CIRCUIT ASSEMBLY

Robert M. Burton and Glen E. Harland, Kokomo, Ind., assignors to General Motors Corporation, Detroit, Mich., a corporation of Delaware Filed Oct. 10, 1967, Ser. No. 674,167
Int. Cl. H02b *1/00, 1/04*
U.S. Cl. 317—100 13 Claims

ABSTRACT OF THE DISCLOSURE

A small composite power circuit assembly in which a miniature circuit is mounted in back-to-back relationship with a power transistor with heat generated by the two being removed laterally from the interface therebetween. In one embodiment the heat is removed through the base member of the power transistor capsule. In another embodiment heat is removed via an element interposed between the power transistor and the circuit.

BACKGROUND OF THE INVENTION

High power circuits even when miniaturized require heat sink assemblies and thermal transfer means which can dissipate the large amounts of heat energy generated by the circuit. Moreover, some circuits require a rather large size power transistor, even though the balance of the circuit is quite small. In such instance both the power transistor and the circuit should both be cooled. It is well known to mount power transistors in capsules having a relatively thick metal base member which serves as a heat sink for the semiconductor element which is in the capsule. Circuit boards having printed resistors and semiconductor chips mounted on them may especially generate enough heat to require special cooling. This is particularly true in higher amperage circuit applications, such as voltage regulators and the like. Hence, even though a circuit board can be miniaturized it still must be cooled. Heretofore the circuit board and the power transistor have been mounted separately, sometimes even on separate heat sinks and then electrically interconnected. Such constructions often are complicated, unduly large and, therefore, expensive. Moreover, the efficiency and reliability of the overall assembly can be adversely affected.

SUMMARY OF THE INVENTION

It is, therefore, an object of this invention to provide a simpler, more compact, less expensive, more efficient and more reliable integrated composite assembly of a power transistor and a miniature circuit in which the power transistor is used.

A further object of this invention is to provide an improved composite power transistor-microcircuit assembly in which the microcircuit is mounted in a back-to-back relationship with the power transistor.

Another object of the invention is to provide an improved mounting technique for high power composite circuit assemblies.

A still further object of the invention is to provide a method for mounting a power transistor and a ceramic printed circuit board and removing heat generated by the two when they are used.

These and other objects of this invention are obtained with a composite power transistor-microcircuit assembly in which a ceramic microcircuit is mounted in back-to-back relationship with the power transistor, and heat generated by the two is laterally removed from the interface therebetween. The power transistor, or in the alternative an intermediate element, serves both to support the circuit board and laterally remove heat to a suitable cooling means.

BRIEF DESCRIPTION OF THE DRAWING

The objects, features and advantages of the invention will become more apparent from the following description of preferred examples thereof and from the drawing, in which.

DESCRIPTION OF THE PREFERRED EMBODIMENTS

Figures 1, 2, 3, 4:
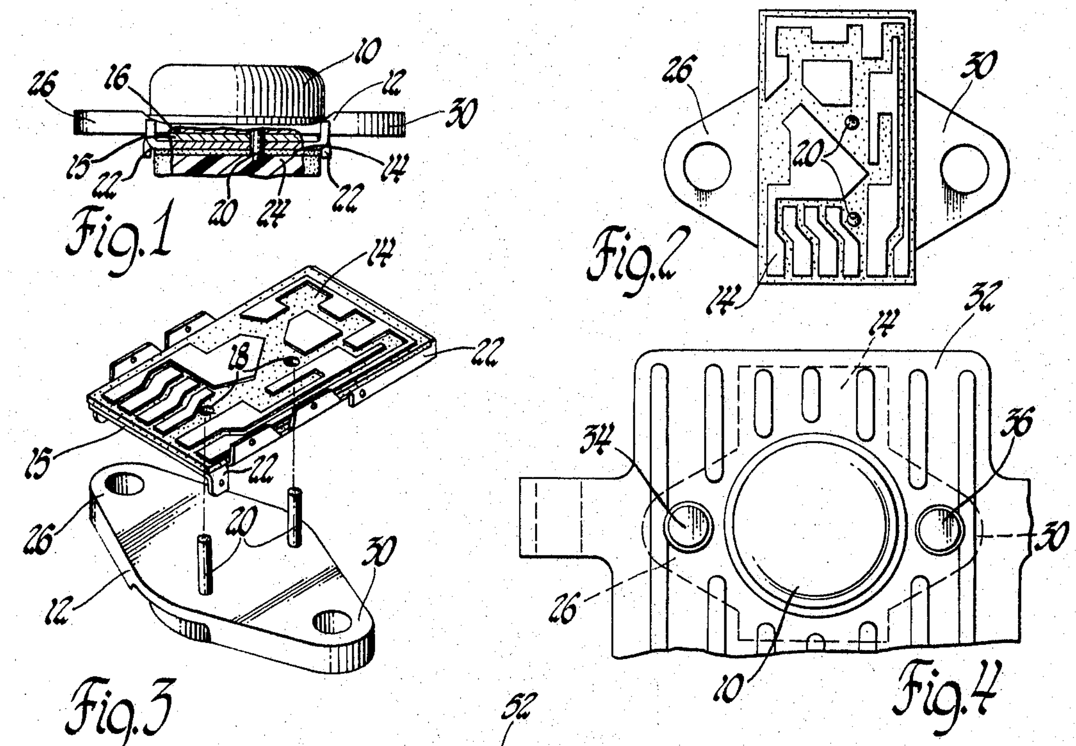
FIGURE 1 shows an elevational side view in partial section of a composite assembly contemplated by the invention in which the circuit board is potted in plastic.
FIGURE 2 shows a bottom view of the assembly shown in FIGURE 1 with the plastic potting removed.
FIGURE 3 shows an exploded elevational view in perspective of the assembly shown in FIGURE 2.
FIGURE 4 shows a plan view of the same assembly mounted in a heat sink.

As can be seen in connection with FIGURES 1 through 3 the invention comprehends a power transistor capsule having a cover 10 and a relatively thick metallic base member 12 of copper or the like mounted back-to-back with a metal-ceramic laminate circuit board 14. The power transistor package shown corresponds to the Electronics Industry Association standard TO–3 package design. This package design, and a method for producing it, is further described in United States Patent No. 3,242,555 Weber. However, this package design includes a base member having a thickness of about one-eighth inch, to act as a heat sink for the power semiconductor element mounted on the base member within the package. The circuit board 14 comprises a thin copper carrier plate 15 which is soldered to a fragile thin wafer 16 of alumina. The ceramic layer is preferably less than 0.03 inch thick and the copper metal layer is about 0.06 inch thick.

The circuit board 14 has appropriate apertures 18 therein registering with terminal elements 20 extending from the transistor base member 12. The terminal elements extend through the circuit board and are appropriately soldered thereto to connect these terminal elements into the circuit assembly. The circuit board 14 is soldered to the underside of the base member 12. Thus, the circuit board 14 is rigidly connected in a back-to-back relationship with a base member of the transistor capsule, with base member leads extending through the circuit board.

Since details of the circuit itself are not significant to the basic and novel characteristics of the invention, they have only been shown in outline form. The circuit pattern can be produced in any desirable manner, such as with cermet compositions which are printed and fired. The surface of the circuit board containing the circuit should be of an electrically insulating material that is heat conductive. The alumina portion of the circuit board provides such a surface. While we prefer to use alumina, other materials possessing the desirable characteristics could be used. The metal plate 15 is included in the preferred circuit board as both a carrier plate and structural support for the fragile thin ceramic wafer 16. While copper is preferred for the carrier plate, other metals can be used, such as aluminum, brass, etc. It has been found to be highly beneficial during processing of the circuit board and as an effective means for mounting the board without subjecting it to deleterious stresses. In addition, it can be used to enhance the adherence of plastic potting compositions used to envelope exposed regions of the circuit board. For example, as shown in FIGURE 1, gripper ears 22 on carrier plate 15 provide an additional mechanical lock of the epoxy plastic potting composition 24 around the circuit assembly.

The potting plastic 24 only envelopes the exposed regions of the circuit board 14, leaving mounting extensions 26 and 30 of transistor base member 12 exposed. These extensions are used for mounting of the composite assembly in a heat radiating element 32 as shown in FIGURE 4. The composite assembly nests in the heat radiating element 32 and bolts 34 and 36 secure the mounting extensions 26 and 30 to the heat radiating assembly 32 to provide an intimate contact therewith. In this manner heat generated by both the semiconductor element in the transistor capsule, and heat generated by the circuit board 14 is removed through the base member of the capsule. The heat passes laterally through the base member to the heat radiating element 32 via base member mounting extensions 26 and 30. In this manner the transistor capsule base member not only functions as thermal transfer means but also as a support for both the circuit board and the transistor itself.

In some circuit applications, such as for a heavy-duty transistorized voltage regulator, one may desire to include a large discrete electrical component, such as a switch, as an integral part of the circuit assembly. In such instance, one might include the additional larger component in an assembly, such as shown in connection with FIGURES 5 and 6. In this embodiment of the invention a transistor capsule 40 is mounted in back-to-back relationship with a circuit board 38 in much the same manner as shown in the preceding figures of the drawing. However, in this embodiment of the invention, intermediate element 42 is interposed between the circuit board 38 and the transistor 40. Intermediate element 42 serves to support both the circuit board 38 and transistor 40. However, it also serves to remove heat generated by the two. In addition, it provides a housing for both the circuit board 38 and the switch 44 which communicates (not shown) with the circuit board 38. Bolts 46 and fasteners 48 secure the transistor 40 and circuit board 38 to the intermediate member 42. While bolting alone may be sufficient, we prefer to also solder the elements together, and to additionally use fasteners 48 as terminal posts for the circuit involved. For this reason bolts 46 are suitably electrically insulated as needed from the circuit board, the transistor and the intermediate member using plastic washers and sleeves as shown. The terminal posts are then connected to appropriate areas of the circuit board by separate leads (not shown).

It is also to be noted that in this embodiment of the invention portions 49 of the metal carrier plate surrounding fasteners 48 are not covered with the ceramic layer but left exposed. In this way, the circuit board can be securely bolted in place without applying any undesirable stress to the ceramic layer.

Peripheral wall 50 of intermediate element 42 forms cavity 52, and provides a damming to contain a plastic potting composition 54 which fills cavity 52. Hence, in this embodiment of the invention the plastic potting 54 does not have to be molded in place but can simply be poured into the cavity 52 to a level sufficient to cover the various components within the cavity. Epoxy is a suitable plastic that can be used. No further cover is, therefore, necessary. On the other hand, where epoxy isolation is not desirable, a metallic or plastic cover element (not shown) can easily be substituted and held in place, for example, with a bolt extending through the assembly mounting bolt hole 55. Hole 55, as well as holes 56 and 58, can be used to mount intermediate element 42 onto a cooling unit, or other heat transfer assembly. Such assembly, as a transistorized voltage regulator, can be easily mounted on the end frame of an alternator for highly effective cooling. In this latter connection heat generated by the power transistor 38 and the circuit board 40 is transferred to the intermediate member 42 and from there laterally directly to the alternator end frame.

Figure 5:
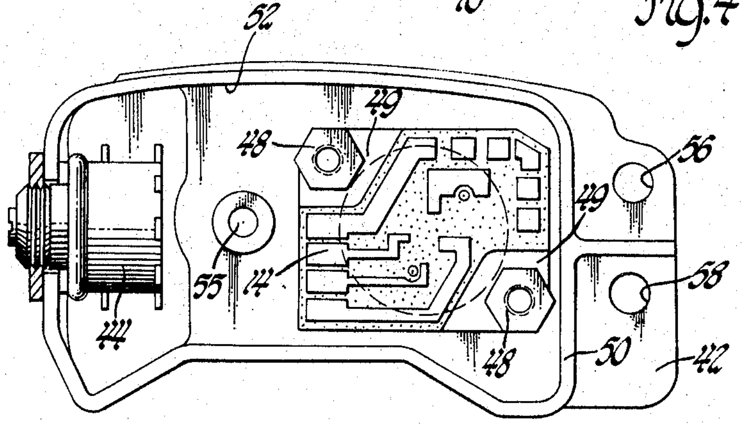
FIGURE 5 shows a plan view of a modification of the invention shown in FIGURE 6, with the plastic potting removed.
Figure 6:
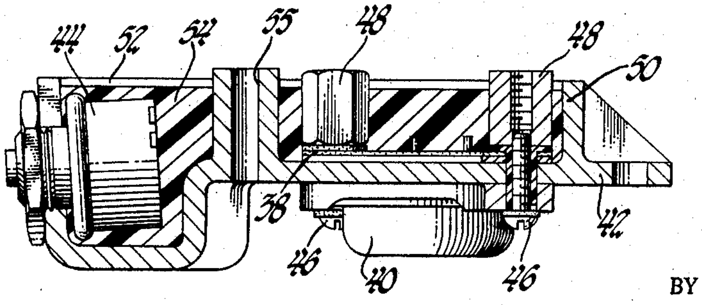
FIGURE 6 shows a sectional view, including plastic potting of the embodiment of the invention shown in FIGURE 5.

While this invention has been described in connection with certain specific examples thereof, no limitation is intended thereby except as defined in the appended claims, as for example one may desire to employ an intermediate heat transfer unit, such as shown in FIGURES 5 and 6, without using it also as a housing member or as a support for additional circuit components.

We claim:

1. A composite power transistor-microcircuit assembly having an integral separately encapsulated power transistor, comprising a power transistor capsule, said capsule having a metallic base member, said base member having a substantially flat outer surface portion, a heat conductive microcircuit board having a circuit pattern on one face thereof assembled in back-to-back relationship with said transistor base member, terminal leads extending from said transistor base member through the circuit board and connected to the exposed face on said board, and means for mounting the resultant assembly on a heat transfer means and extracting heat laterally from the interfacial region between said circuit board and said transistor base member.

2. The composite power transistor-microcircuit assembly defined in claim 1 wherein the transistor base member is a thick heat sink element having integral lateral extensions thereon in effective thermal communication with the base member region therebetween, and said lateral extensions include means for mounting said resultant assembly to extract heat laterally from said interfacial region.

3. The composite power transistor-microcircuit assembly defined in claim 1 wherein exposed portions of the circuit board are enveloped in plastic, the circuit board is a metal-ceramic laminate, and the metal portion of the circuit board has means for enhancing adherence of the plastic envelope.

4. The composite power transistor-microcircuit assembly defined in claim 1 wherein a heat conductive element is interposed between the base member of the power transistor capsule and the circuit board, and said intermediate member includes means for mounting said resultant assembly to laterally extract heat from said interfacial region.

5. The composite power transistor-microcircuit assembly defined in claim 4 wherein the intermediate member has an extensive lateral dimension beyond the periphery of the power transistor and the circuit board, at least one electrical component is mounted on said intermediate member, and said circuit board and additional component is enclosed by a housing means on said intermediate member.

6. The composite power transistor-microcircuit assembly defined in claim 4 wherein the intermediate member additionally includes means for housing the circuit board portion of the assembly.

7. The composition power transistor-microcircuit assembly defined in claim 6 wherein said housing means on said intermediate member includes a peripheral wall surrounding said circuit board, said wall has a height greater than the thickness of said circuit board to form a cavity in which said circuit board is recessed, and said cavity is substantially filled with a plastic potting compound.

8. The composite power transistor-microcircuit assembly defined in claim 1 wherein the circuit board is a metal-ceramic laminate, the circuit pattern on the exposed face of said board is of a printed and fired cermet, and the metal portion of said board is soldered directly to the base member of said power transistor.

9. The composite power transistor-microcircuit assembly defined in claim 1 wherein the circuit board is a metal-ceramic laminate, at least one region of the copper portion of the circuit board is unlaminated, and the circuit board is pressed to its support in said unlaminated copper region.

10. The composite power transistor-microcircuit assembly defined in claim 9 wherein the metal layer of said laminated circuit board is copper and the ceramic layer is alumina.

11. The composite power transistor-microcircuit assembly defined in claim 1 wherein a thick heat conductive metallic element is interposed between the base member of the power transistor and the circuit board, the intermediate member includes means for mounting said assembly to laterally extract heat from said interfacial region, said transistor base member has oppositely disposed integral lateral extensions thereon for mounting the transistor capsule, each of said lateral extensions have at least one aperture therein registering with a corresponding aperture in the intermediate element, said circuit board has an aperture therein registering with the aforementioned apertures, and bolt means presses the capsule base member, the intermediate member and the circuit board together.

12. The composite power transistor-microcircuit assembly defined in claim 11 wherein the circuit board is a metal-ceramic laminate, the metal portion of said circuit board is not laminated with ceramic surrounding said aperture, and said assembly includes means for selectively electrically communicating said transistor base member with portions of the circuit on said circuit board.

13. The composite power transistor-microcircuit assembly as defined in claim 12 wherein the metal layer of said laminated circuit board is copper and the ceramic layer is alumina.

References Cited

UNITED STATES PATENTS

| | | | |
|---|---|---|---|
| 3,106,665 | 10/1963 | Byles | 317—100 |
| 3,147,402 | 9/1964 | Hochstetler | 317—100 |

LEWIS H. MYERS, Primary Examiner

D. A. TONE, Assistant Examiner